United States Patent
Toyohara et al.

(10) Patent No.: US 9,343,605 B2
(45) Date of Patent: May 17, 2016

(54) PHOTOVOLTAIC EQUIPMENT

(75) Inventors: Makoto Toyohara, Kamisu (JP); Youji Ono, Tainai (JP)

(73) Assignee: KURARAY CO., LTD., Kurashiki-shi (JP)

( * ) Notice: Subject to any disclaimer, the term of this patent is extended or adjusted under 35 U.S.C. 154(b) by 291 days.

(21) Appl. No.: 13/882,046

(22) PCT Filed: Oct. 21, 2011

(86) PCT No.: PCT/JP2011/074324
§ 371 (c)(1),
(2), (4) Date: Jul. 22, 2013

(87) PCT Pub. No.: WO2012/057033
PCT Pub. Date: May 3, 2012

(65) Prior Publication Data
US 2013/0291928 A1    Nov. 7, 2013

(30) Foreign Application Priority Data

Oct. 27, 2010 (JP) ................ 2010-241226

(51) Int. Cl.
*H01L 31/042* (2014.01)
*H01L 31/052* (2014.01)
(Continued)

(52) U.S. Cl.
CPC ........ *H01L 31/0524* (2013.01); *H01L 31/0543* (2014.12); *H02S 30/10* (2014.12); *Y02E 10/52* (2013.01)

(58) Field of Classification Search
CPC ..... H02S 20/22; H02S 30/10; H01L 31/0543; H01L 31/0524; F24J 2/5205; F24J 2/085; F24J 2/526; F24J 2/08; Y02E 10/52
See application file for complete search history.

(56) References Cited

U.S. PATENT DOCUMENTS

| | | | |
|---|---|---|---|
| 4,511,755 A | * | 4/1985 | Mori ............ F21S 11/00 126/698 |
| 5,125,983 A | | 6/1992 | Gummings |
| 7,658,071 B1 | | 2/2010 | McDermott |

(Continued)

FOREIGN PATENT DOCUMENTS

| | | |
|---|---|---|
| EP | 1 895 597 A1 | 3/2008 |
| JP | 58-199303 | 11/1983 |

(Continued)

OTHER PUBLICATIONS

International Search Report Issued Nov. 15, 2011 in PCT/JP11/074324 Filed Oct. 21, 2011.

(Continued)

*Primary Examiner* — Devina Pillay
(74) *Attorney, Agent, or Firm* — Oblon, McClelland, Maier & Neustadt, L.L.P

(57) ABSTRACT

A photovoltaic unit can minimally reduce a displacement of focus positions from solar cells and prevent a decrease in power generation efficiency even if elastic behaviors of a Fresnel lens sheet and a base plate on which solar cells are arranged due to changes in temperature and humidity are different. The photovoltaic unit includes an integrated multiple Fresnel lens sheet and a base plate on which solar cells are arranged adjacent to the focus positions of individual Fresnel lenses. The multiple Fresnel lens sheet is fixed to the base plate by a lens sheet fixing element at a lens sheet fixing portion adjacent to the center of gravity of the sheet.

5 Claims, 9 Drawing Sheets

(51) Int. Cl.
    *H01L 31/054*     (2014.01)
    *H02S 30/10*     (2014.01)

(56) References Cited

U.S. PATENT DOCUMENTS

| | | | |
|---|---|---|---|
| 2009/0126794 A1 * | 5/2009 | Dimroth | H01L 31/0543 136/259 |
| 2009/0133737 A1 | 5/2009 | Anzawa et al. | |
| 2009/0183762 A1 | 7/2009 | Jackson et al. | |
| 2011/0048497 A1 | 3/2011 | Okamoto et al. | |
| 2011/0061717 A1 | 3/2011 | Kwon et al. | |

FOREIGN PATENT DOCUMENTS

| | | |
|---|---|---|
| JP | 11 26800 | 1/1999 |
| JP | 2005 317588 | 11/2005 |
| KR | 10-2009-0040200 A | 4/2009 |
| KR | 10-2009-0125993 A | 12/2009 |
| TW | 221525 A | 3/1994 |
| WO | WO 2006/070425 A1 | 7/2006 |
| WO | WO 2009038307 A2 * | 3/2009 |
| WO | 2009 090843 | 7/2009 |
| WO | WO 2009/128422 A1 | 10/2009 |

OTHER PUBLICATIONS

Extended European Search Report issued Feb. 16, 2015 in Patent Application No. 11836167.4.
Office Action issued May 26, 2014 in Korean Patent Application No. 10-2013-7012948.
Korean Office Action issued Sep. 29, 2014 in Patent Application No. 10-2013-7012948 (without English Translation).
Japanese Office Action mailed on Oct. 27, 2015 in Japanese Patent Application No. 2012-540827.
Taiwanese Office Action issued Jul. 21, 2015 in Taiwanese Patent Application No. 100138854.

* cited by examiner

CALCULATED VALUES

FIG.10B

MEASURED VALUES

FIG.11

PHOTOVOLTAIC EQUIPMENT

CROSS REFERENCE TO RELATED APPLICATION

The present application is based on and claims priority from Japanese Patent Application No. 2010-241226, filed on Oct. 27, 2010, the disclosure of which is hereby incorporated by reference in its entirety.

TECHNICAL FIELD

The present invention relates to a photovoltaic unit using a resin Fresnel lens, in particular, to one incorporating an integrated multiple Fresnel lens sheet.

BACKGROUND ART

In recent years the use of natural energy as renewable source of power has received great attention. One example is power generation with photovoltaic cells (solar cells), utilizing solar radiation. To increase the amount of power generation, a collector including reflective mirrors and lenses in combination to collect light on solar cells has been proposed (refer to Patent Document 1). For example, Patent Document 2 discloses a collector in which a large number of light-collecting Fresnel lenses are arranged on the same plane and each solar cell is arranged at the focus position of each Fresnel lens as a unit. The Fresnel lenses for such a collector are generally formed by casting, injection molding, press molding, or transcription molding as photopolymerization (2P) using a UV curable resin, using a metal mold cut from a cut metal plate with a lathe.

To arrange the solar cells at the focus positions of the Fresnel lenses, the lenses can be individually mounted in frames. For the sake of facilitating manufacturing, it is proposed that a large number of light-collecting Fresnel lenses (unit lenses) in FIG. 1 be arranged on the same plane to form a sheet (hereinafter, multiple Fresnel lens sheet) and fix it in a frame.

The Fresnel lenses need to be translucent and made from transparent resin or inorganic glass. The transparent resin is preferably used because of light weight and ease of manufacturing.

FIG. 2 schematically shows an example of a photovoltaic unit as seen from the cross section of a Fresnel lens sheet. It includes a base plate 2 (hereinafter may be referred to as solar cell plate) on which solar cells 3 are arranged and a multiple Fresnel lens sheet 1 on a light incidence side of the solar cells 3. The sheet is supported in a frame 4 so that each of the solar cells is disposed at the focus position of each Fresnel lens. The Fresnel lens sheet 1 and frame 4 may be damaged by a difference in elasticity due to a temperature or humidity change if the sheet and frame are too firmly fixed. In view of this, it is preferable that the sheet is movably held in a planar direction. Further, the solar cells are often placed on a metal plate for the purpose of heat radiation.

Meanwhile, it is necessary to sufficiently reduce a gap between the sheet and the frame in order to prevent rain drops or dust from entering inside which would otherwise cause failures. FIG. 8 shows the structure which can achieve both of the above, for example. In this structure a seal element 8 is provided at one end of the sheet 1 and the sheet 1 and a metal frame 7 are fixed with a screw 6. With such a structure the sheet can be fixed along the thickness with a sufficiently reduced gap and at the same time it is movable in a planar direction.

It is essential to accurately set the focus positions of the Fresnel lenses relative to the corresponding solar cells in view of power generation efficiency. However, the multiple Fresnel lens sheet and frame are in general made from different materials from those of the base plate on which the solar cells are disposed so that with a change in temperature or humidity, they differently behave in terms of elasticity. This may cause a displacement of the focus position of each unit lens from the solar cell, resulting in a decrease in the power generation efficiency. This is particularly significant for a resin Fresnel lens sheet.

With a change in temperature or humidity, the sheet in FIG. 8 expands and shrinks radially around a single point most firmly fixed on the frame. Therefore, a problem arises that the focus position of the unit lens in the portion furthest from the single point is greatly shifted from the corresponding solar cell.

Moreover, it is difficult to estimate which portion of the sheet will be the center point of expansion and design the sheet with the displacement taken into consideration. With use of a rectangular multiple Fresnel lens sheet, if the center point falls in the vicinity of any of the four corners, the focus position in the opposite corner will be most displaced from the solar cell.

CITATION LIST

Patent Document

Patent Document 1: U.S. Pat. No. 5,125,983
Patent Document 2: Japanese Patent Application Publication No. H11-026800

SUMMARY OF INVENTION

Technical Problem

An object of the present invention is to minimally reduce a displacement of the focus positions of the lenses from the solar cells even if the Fresnel lens sheet and the base plate on which the solar cells are arranged elastically behave differently due to temperature or humidity changes, as well as to prevent a decrease in power generation efficiency.

Solution to Problem

The above object is achieved by a photovoltaic unit which comprises an integrated multiple Fresnel lens sheet and a base plate on which solar cells are arranged adjacent to a focus position of each Fresnel lens, wherein the multiple Fresnel lens sheet is fixed to the base plate at a lens sheet fixing portion adjacent to a center of gravity of the sheet.

Preferably, the lens sheet fixing portion is adjacent to the center of gravity of the sheet and at a boundary of individual Fresnel lenses.

Further, the multiple Fresnel sheet can have a second fixing portion in addition to the lens sheet fixing portion, and the multiple Fresnel sheet is movable only in a direction connecting the lens sheet fixing portion and the second fixing portion.

In this case the second fixing portion can be adjacent to an end of the entire multiple Fresnel lens sheet.

Advantageous Effects of the Invention

According to the present invention, it is possible to minimally reduce a displacement of the focus positions of the individual Fresnel lenses from the solar cells even if the Fresnel lens sheet expands or shrinks due to a temperature or humidity change.

BRIEF DESCRIPTION OF THE DRAWINGS

FIG. 10B shows measured values of displacement amount of the multiple Fresnel lens sheet relative to the frame with a change in hygrothermal condition according to a fifth embodiment;

FIG. 11 shows the displacement amount of the multiple Fresnel lens sheet when it is fixed at the center of a long side (first comparison);

DESCRIPTION OF EMBODIMENTS

Figure 1:
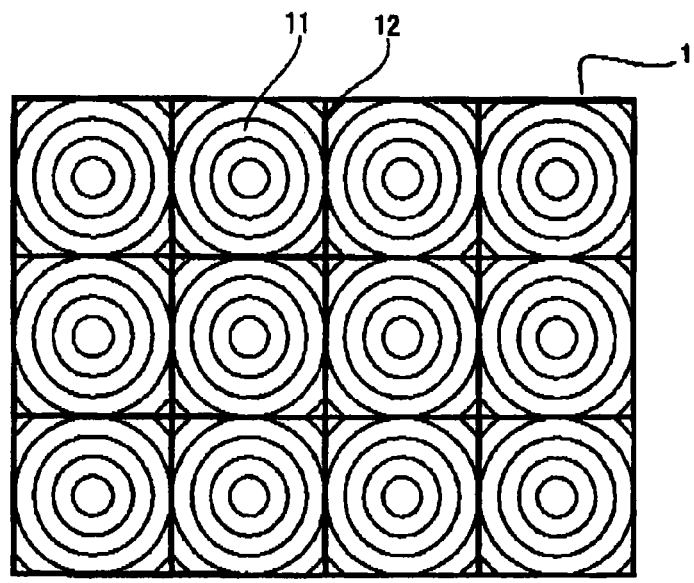
FIG. 1 shows an example of multiple Fresnel lens sheet.
Figure 2:
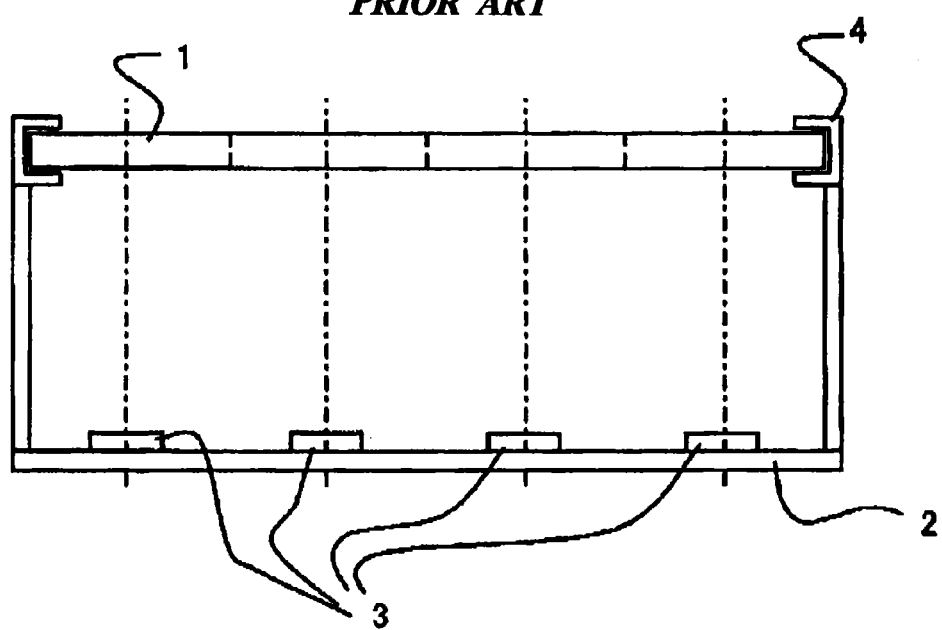
FIG. 2 is a cross section view of a photovoltaic unit.
Figure 3:
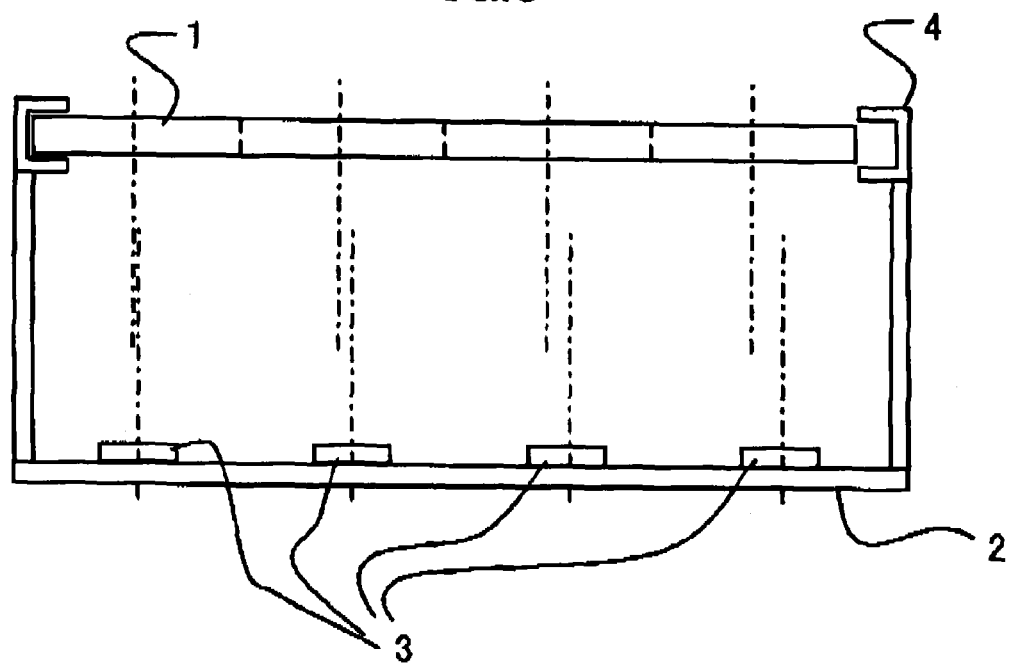
FIG. 3 shows a positional relation between lenses and a base plate when the lenses shrink relative to the base plate because of a change in temperature and humidity.

FIG. 3 shows that the multiple Fresnel lens sheet 1 of the photovoltaic unit in FIG. 2 has shrunk relative to the base plate 2 because of a change in temperature or humidity. The center or the focus position of a Fresnel lens 11 at the right end of the drawing is greatly shifted relative to a corresponding solar cell, reducing the power generation efficiency.

Figure 4:
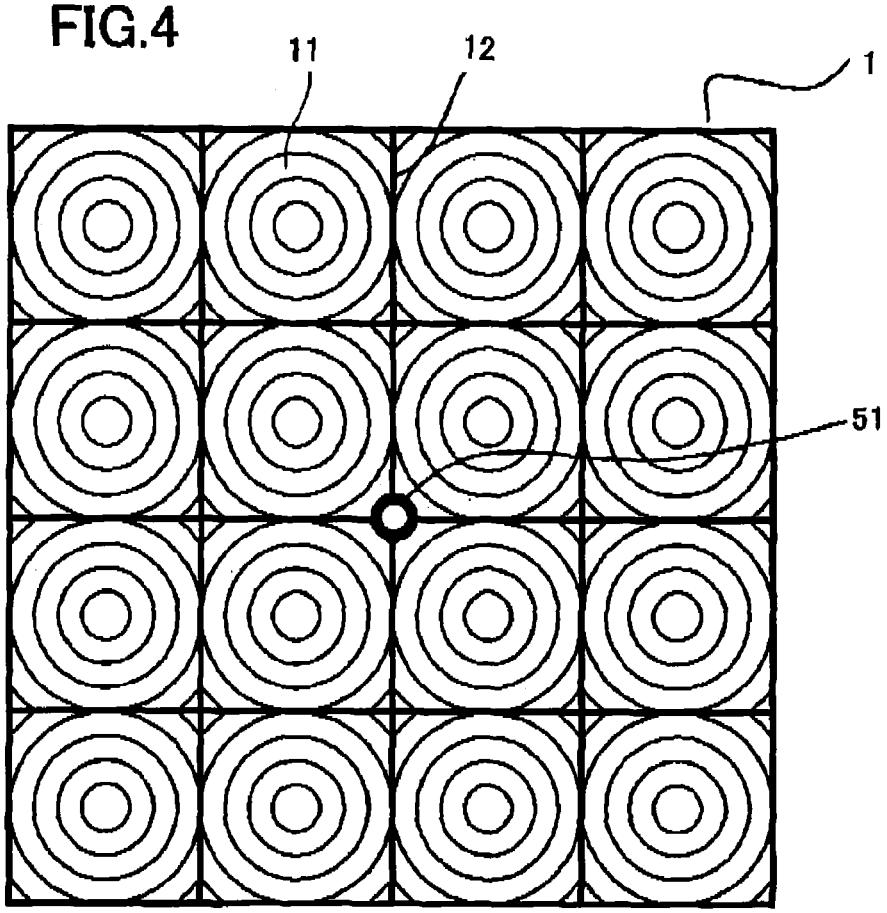
FIG. 4 shows an example of multiple Fresnel lens sheet including a fixing portion.
Figure 5A:
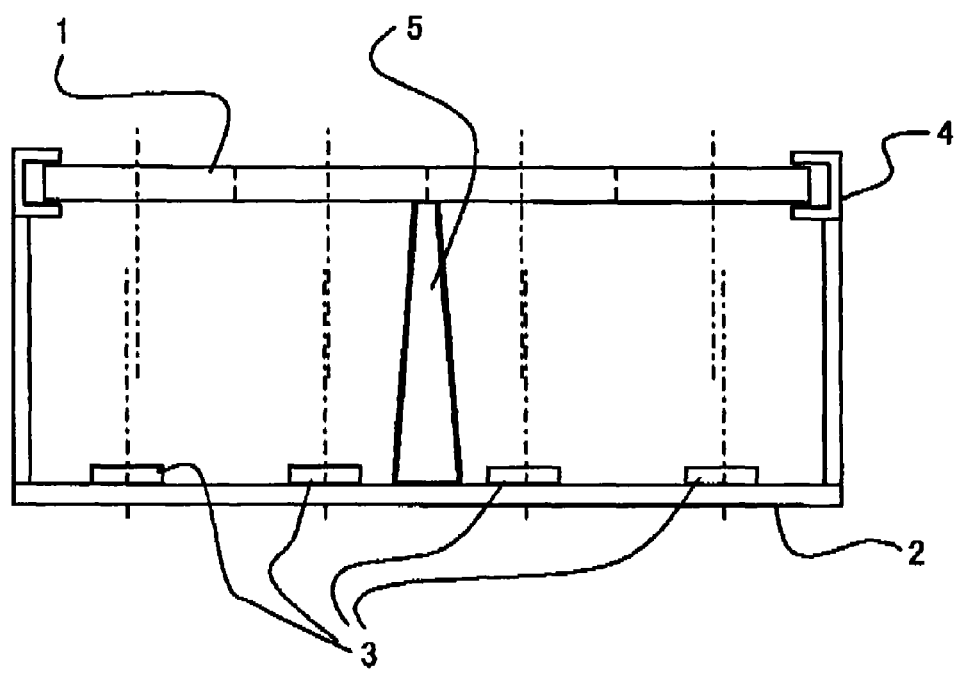
FIG. 5A shows a positional relation between a multiple Fresnel lens sheet fixed with a columnar fixing element and a base plate when the sheet shrinks relative to the base plate.
Figure 5B:
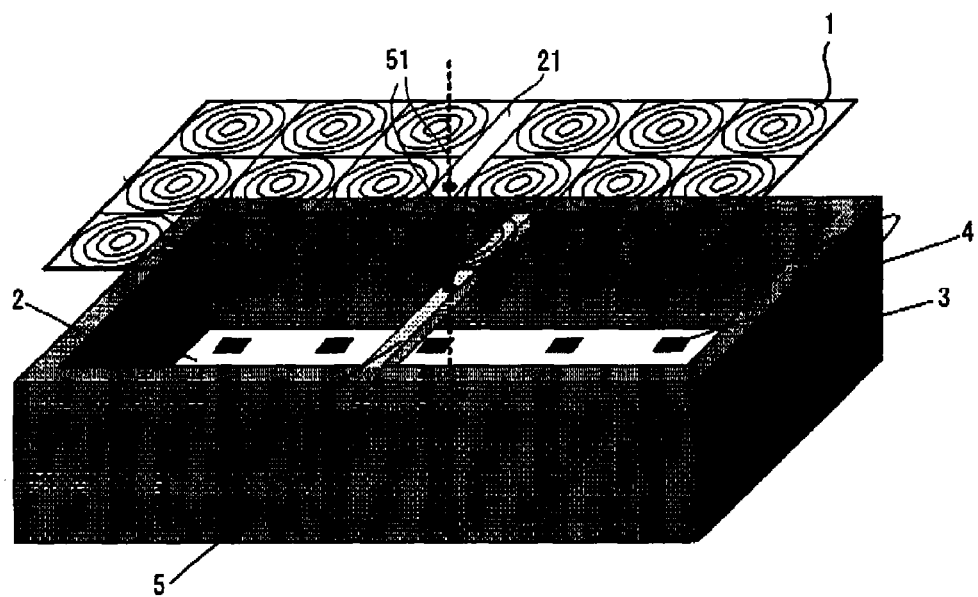
FIG. 5B shows how to mount the sheet when a fixing element of a beam structure is used by way of example.

Meanwhile, FIG. 4 shows the multiple Fresnel lens sheet according to an example of the present invention which includes a lens sheet fixing portion 51 adjacent to the center of gravity on the sheet surface. The lens sheet is fixed to the solar cell plate 2 via a lens sheet fixing element 5 as shown in FIGS. 5A, 5B. Note that herein, "adjacent to the center of gravity" refers to being in a distance between the centers of neighboring unit lenses from the center of gravity of the multiple Fresnel lens sheet 1.

Now, FIG. 5A shows that the multiple Fresnel lens sheet 1 of the photovoltaic unit according to the present embodiment has shrunk relative to the base plate 2 because of a change in temperature or humidity. A shift in the center or the focus position of each Fresnel lens 11 in the right and left ends relative to a corresponding solar cell is relatively small, reducing a decrease in the power generation efficiency.

According to the present invention a lens sheet fixing portion 51 is provided on the surface of the multiple Fresnel lens sheet near the center of gravity. Because of a general rectangular shape thereof, the center of gravity is at the center of the line connecting the centers of long sides of the multiple Fresnel lens sheet as shown in FIG. 4.

In forming the multiple Fresnel lens sheet, a small non-use area in which no lenses are formed may occur at the joints of lenses or lens molds. It is preferable to provide the lens sheet fixing portion in such a non-use area.

Figure 6:
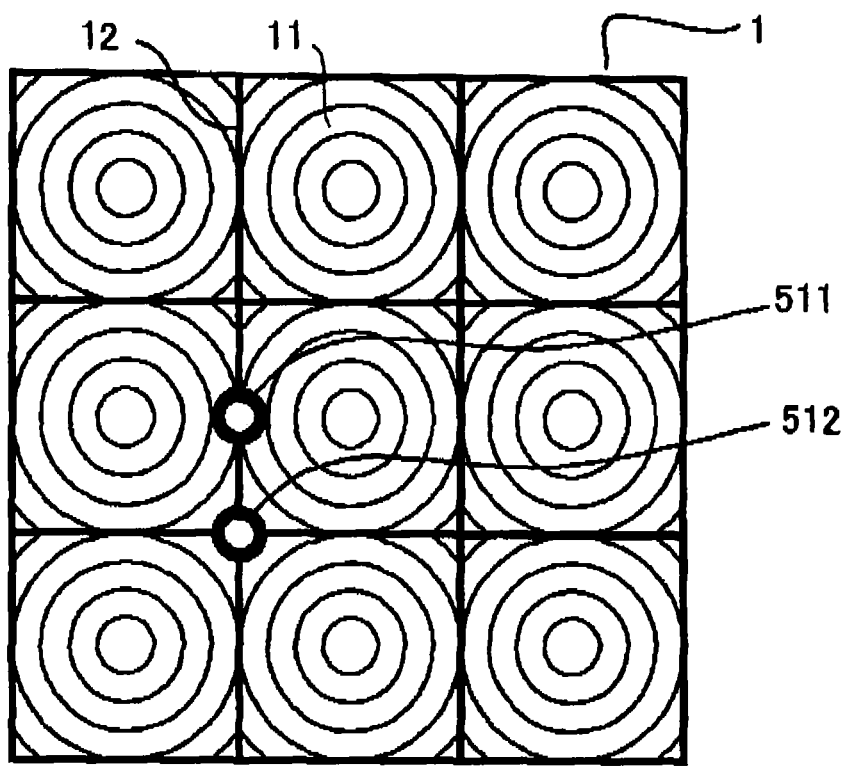
FIG. 6 shows an example of multiple Fresnel lens sheet with a fixing portion in the vicinity of the center of gravity.

Meanwhile, with respect to a multiple Fresnel lens sheet in an odd-number column and an odd-number row, for example, 3 columns, 3 rows in FIG. 6, the center thereof comes in the vicinity of the unit lens at the center. In this case it is preferable to provide the lens sheet fixing portion at a boundary 12 of the individual Fresnel lenses which is somewhat away from the center of the multiple Fresnel lens sheet. FIG. 6 shows two examples, a lens sheet fixing portion 511 provided at the boundary 12 of the two sides of the two unit lenses and a lens sheet fixing portion 512 provided at the boundary 12 of the four corners of the four unit lenses.

In terms of preventing interference with optical transmittance, the lens sheet fixing element 5 is preferably provided in a portion other than a pyramid-like focus area whose bottom side is the Fresnel lens 11 and apex is the solar cell 3, as shown in FIG. 5A.

Further, with the multiple Fresnel lens sheet fixed at the lens sheet fixing portion 51 as shown in FIG. 5B, the lens sheet fixing element 5 is preferably of a beam structure 21 disposed below the multiple Fresnel lens sheet 1 to be able to prevent a flexure of the sheet by its own weight.

The present invention is applicable to each of divided multiple Fresnel lens sheets of a large-size photovoltaic unit using solar cells 3 in an 8-by-8 or more matrix. For example, in a large-size photovoltaic unit with solar cells 3 in a 12-by-12 matrix, two multiple Fresnel lens sheets 1 in a 6-by-12 matrix are fixed in the vicinity of the respective centers of gravity. Alternatively, four multiple Fresnel lens sheets in a 6-by-6 matrix can be fixed in the vicinity of the respective centers of gravity.

Moreover, in adhering the multiple Fresnel lens to a frame element, a warpage may occur in the sheet because of thermal expansion or expansion by water absorption. In view of preventing this, a seal element which enables fixation with no adhesive can be provided on both or at least either of the sheet and the frame element. The seal element is preferably a flexible element with less friction resistance, for example.

Further, each of the solar cells 3 can include a secondary optical collector to compensate for the displacement of the focus position.

Another Example

Figure 7:
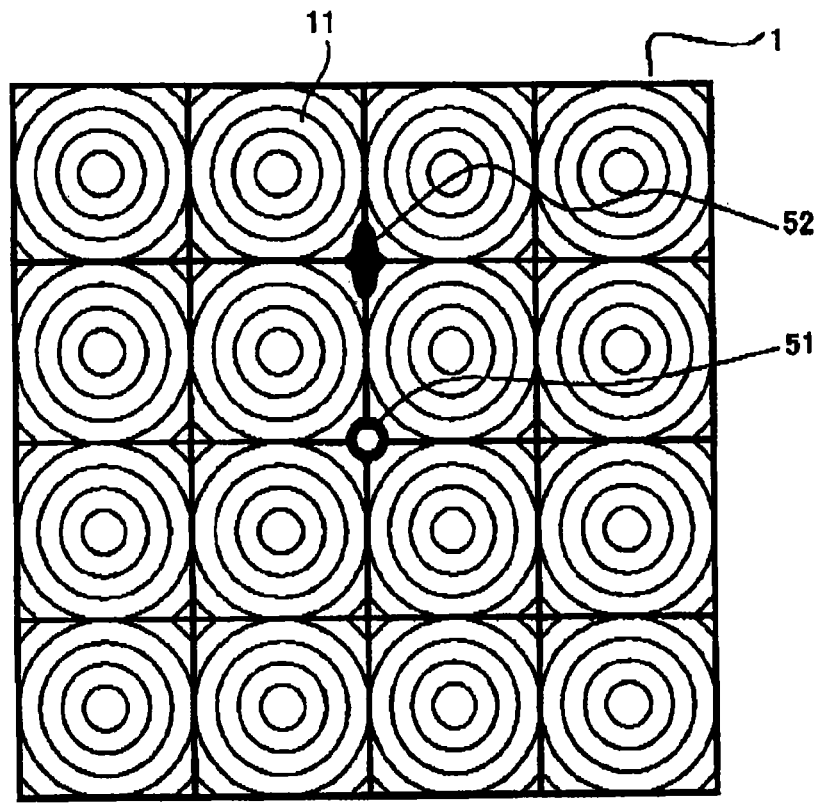
FIG. 7 shows an example of multiple Fresnel lens sheet with a second fixing portion.
Figure 8:
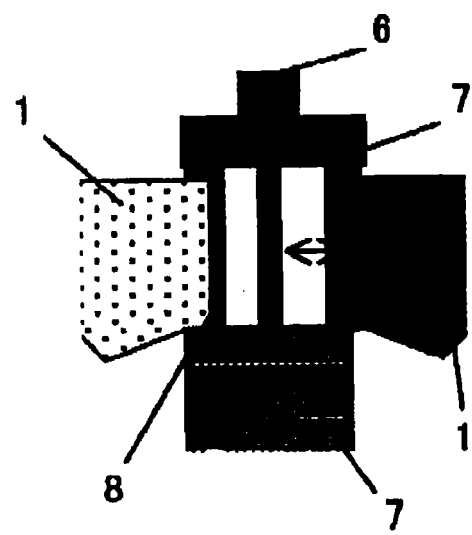
FIG. 8 shows how to fix the multiple Fresnel lens sheet to the frame.

The sheet can include a second fixing portion 52 not to hinder the elasticity of the sheet in addition to the lens sheet fixing portion adjacent to the center of gravity of the sheet. As shown in FIG. 7, the second fixing portion 52 is, for example, preferably placed on the line in elastic direction (radial direction) around the lens sheet fixing portion and configured to prevent the sheet from rotating about the lens sheet fixing portion 51 as a rotational axis without hindering the elasticity of the sheet.

Moreover, preferably, the second fixing portion is placed near the end of the entire multiple Fresnel lens sheet. Thereby, it is possible to effectively prevent the sheet from rotating about the lens sheet fixing portion.

Further, it is more preferable that the second fixing portion is a notch at the end of the entire multiple Fresnel lens sheet. By covering the notch with the frame element in which the multiple Fresnel lens sheet is fixed, it can prevent dust or water from entering the notch.

Figure 14:
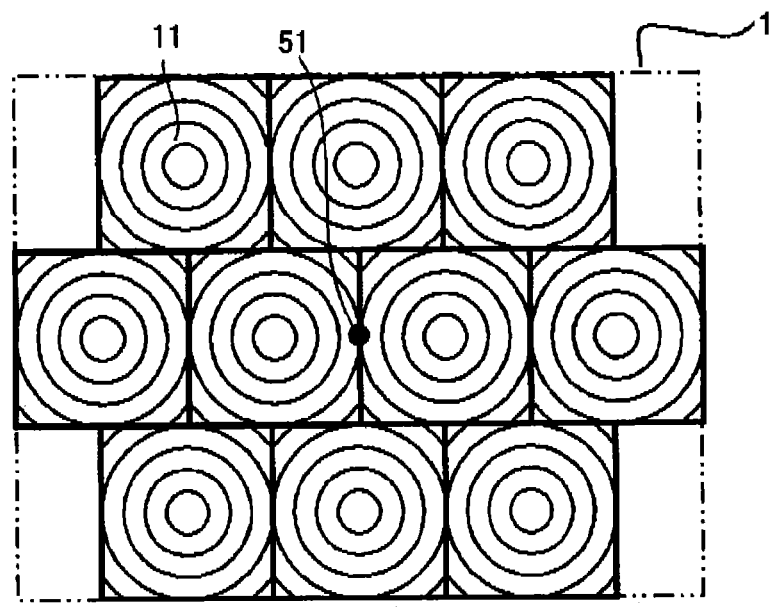
FIG. 14 shows the outer form of another example of multiple Fresnel lens sheet.

The outer form of the multiple Fresnel lens sheet is not limited to a rectangle, as shown in FIG. 14, for example. According to the present invention, the rectangle indicated by the thin line surrounding the entire Fresnel lens sheet in FIG. 14 is regarded as outer form, for instance.

EXAMPLES

Calculation

In the following, examples of a multiple Fresnel lens sheet made from acrylic resin fixed to an aluminum frame are described. Using these examples, amounts of displacement of the Fresnel lens sheet from the frame by a temperature or humidity change were calculated at the centers of the unit lenses. The amounts changed in distance from a fixed point.

In the calculation linear coefficient of expansion of the acrylic resin is $6.6 \times 10^{-5}$ (1/deg C.), linear coefficient of expansion of the aluminum is $2.35 \times 10^{-5}$ (1/deg C.), coefficient of hygroscopic expansion of the acrylic resin is 0.3% (humidity 0% to 85%) and coefficient of hygroscopic expansion of the aluminum is 0% (humidity 0% to 85%).

Figure 9:
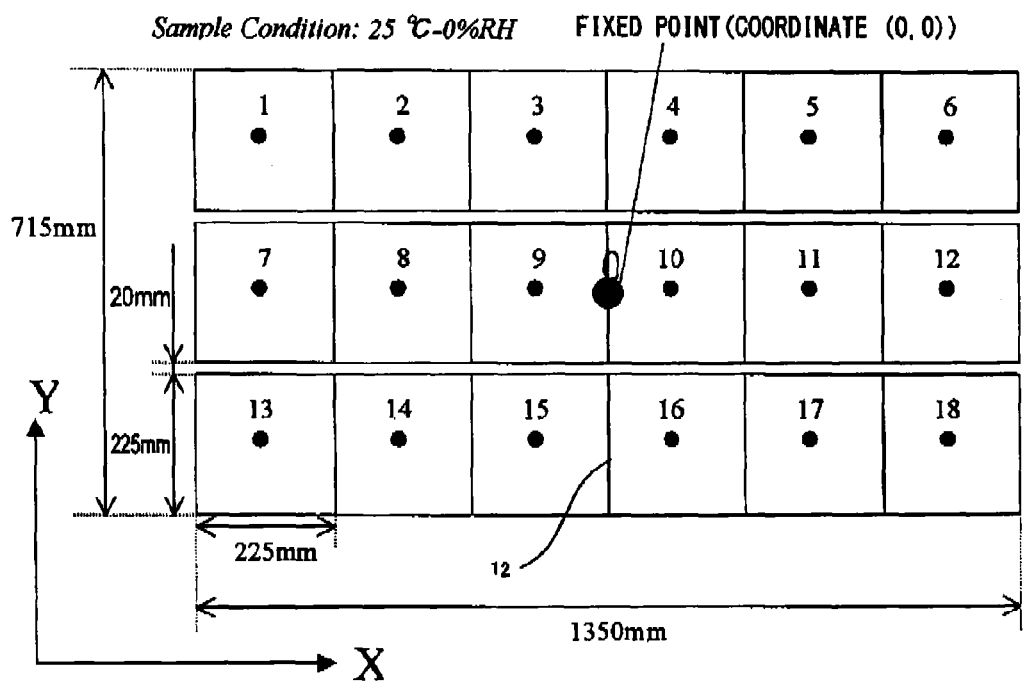
FIG. 9 shows an example of multiple Fresnel lens sheet in 6 columns and 3 rows.

Note that a description of the unit lenses at symmetric position relative to the fixed point is omitted. In FIG. 9 the unit lenses are numbered 1 to 18 rightward from the left corner in the top row to the right corner.

First Example

Figure 10A:
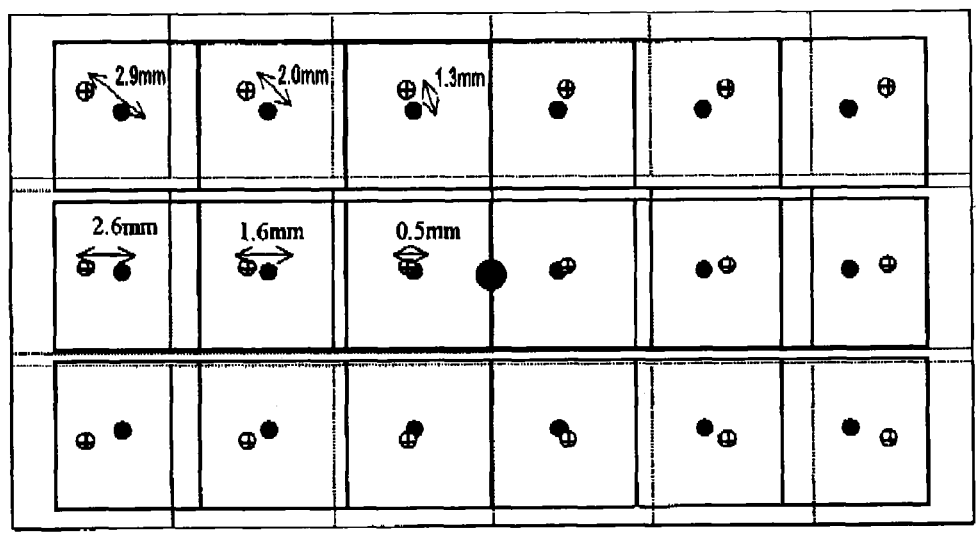
FIG. 10A shows calculated values of displacement amount of the multiple Fresnel lens sheet relative to the frame with a change in hygrothermal condition according to a first embodiment.

FIG. 10A shows the results of calculation using the multiple Fresnel lens sheet in 6 columns and 3 rows in FIG. 9 structured as below and fixed at the center of the sheet when ambient condition is changed from 25 deg C.*0% RH to 65 deg C.*85% RH.

Figure 13A:
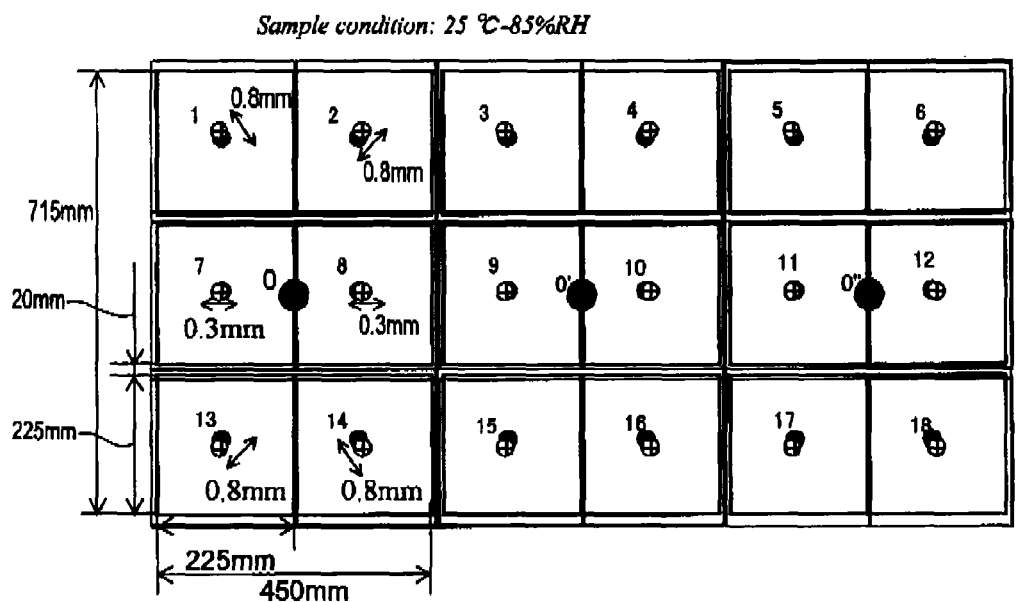
FIG. 13A shows the displacement amount of multiple Fresnel lens sheets in 2 columns and 3 rows when it is fixed at the center (third example)
Figure 13B:
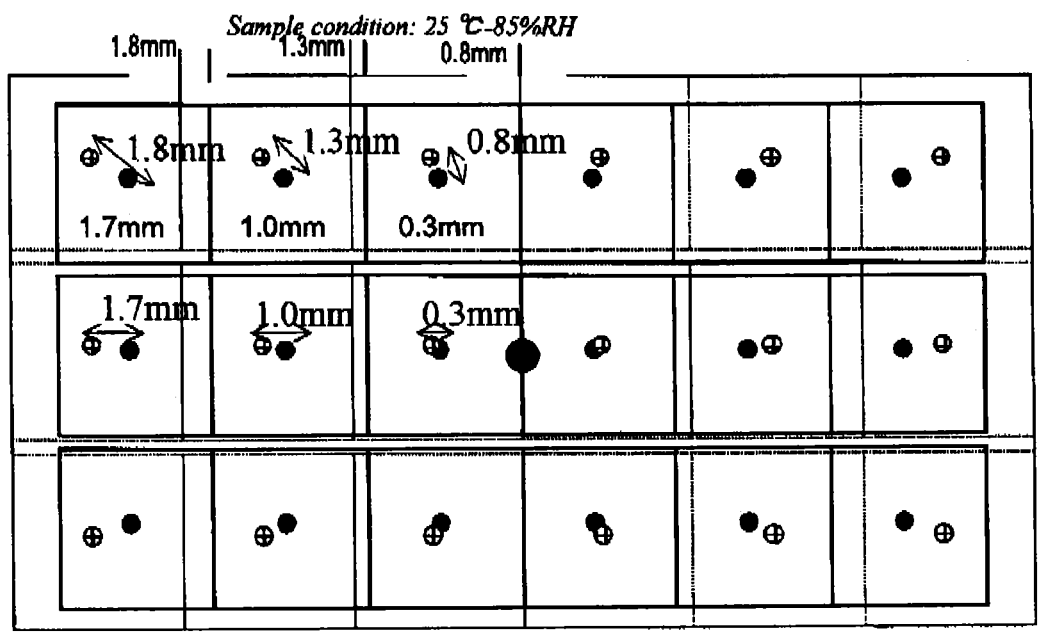
FIG. 13B shows the displacement amount of a multiple Fresnel lens sheet in 6 columns and 3 rows when it is fixed at the center (second example)

Outer form of sheet: rectangle in 715 mm by 1,350 mm
 Size of unit Fresnel lens: square in 225 mm by 225 mm
 Gap between unit Fresnel lenses: vertically 20 mm, horizontally 0 mm Second Example FIG. 13B shows the results of calculation using the same lens sheet as in the first example when ambient condition is changed from 25 deg C.*0% RH to 25 deg C.*85% RH.

Third Example

FIG. 13A shows the results of calculation using three multiple Fresnel lens sheets structured as below, arranged in 2 columns and 3 rows without a gap and fixed at the center of the sheet when ambient condition is changed from 25 deg C.*0% RH to 25 deg C.*85% RH.

Outer form of sheet: rectangle in 715 mm by 450 mm
 Size of unit Fresnel lens: square in 225 mm by 225 mm
 Gap between unit Fresnel lenses: vertically 20 mm, horizontally 0 mm Fourth Example A multiple Fresnel lens sheet in 6 columns, 3 rows as structured below was formed by injection molding with a metal mold.

Resin: acrylic resin, Parapet® manufactured by Kuraray Co. Ltd.
 Outer form of sheet: rectangle in 715 mm by 1,350 mm
 Size of unit Fresnel lens: square in 225 mm by 225 mm
 Gap between unit Fresnel lenses: vertically 20 mm, horizontally 0 mm
 Material of frame and solar cell plate: aluminum Fifth Example FIG. 10B shows measured values of changes in the positions of unit Fresnel lenses and corresponding solar cells in sheet surface direction immediately after and left at 25 deg C.*0% RH and at 85 deg C.*0% RH for ten days, when the sheet was fixed at the center.

It is understood from the drawing that the results obtained in the first example match those in the first example.

First Comparison

Figures 10B, 11:
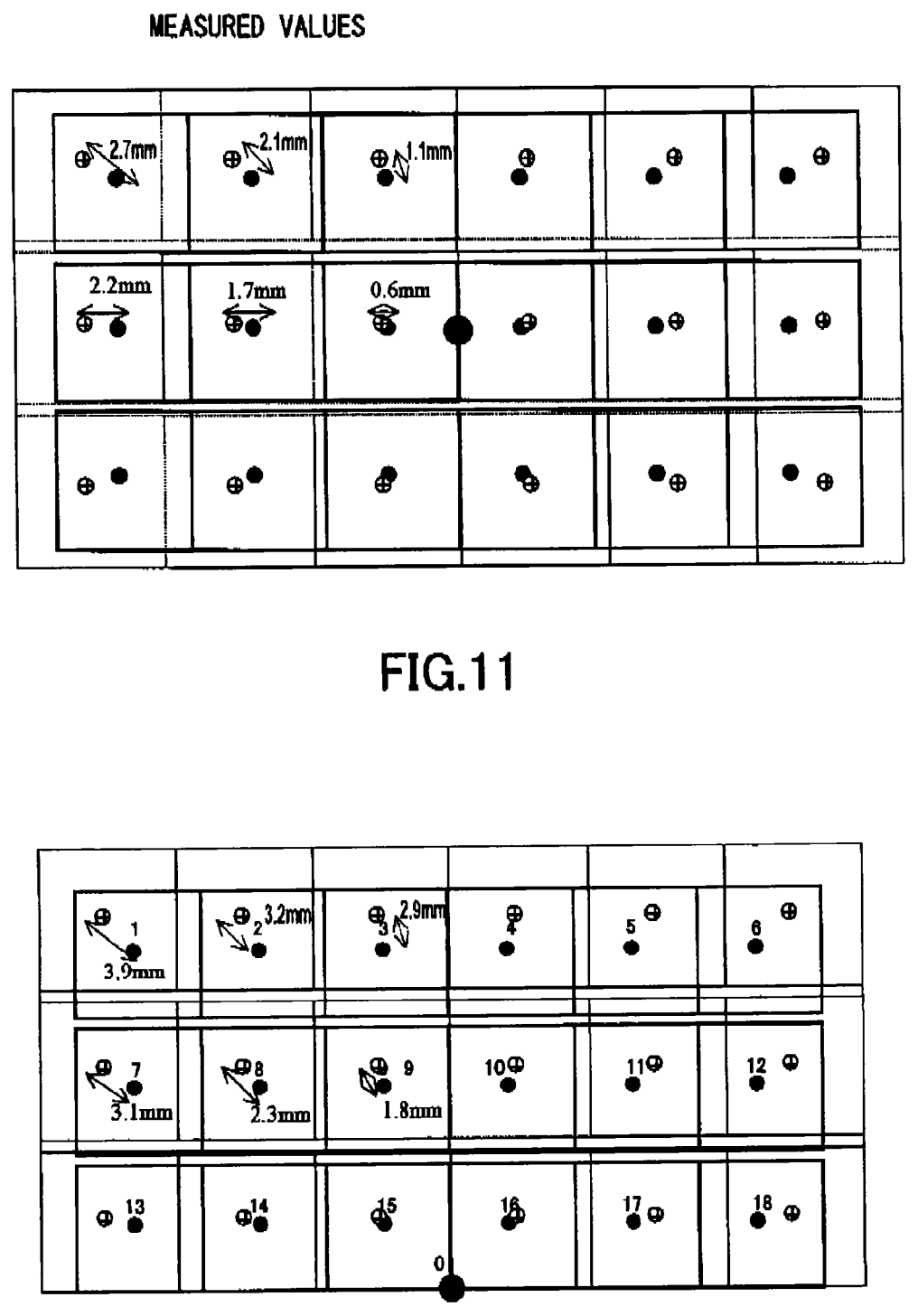

FIG. 11 shows the results of calculation using the same multiple Fresnel lens sheet as in the first example when the sheet is fixed at the center of the long side of the sheet.

Second Comparison

Figure 12:
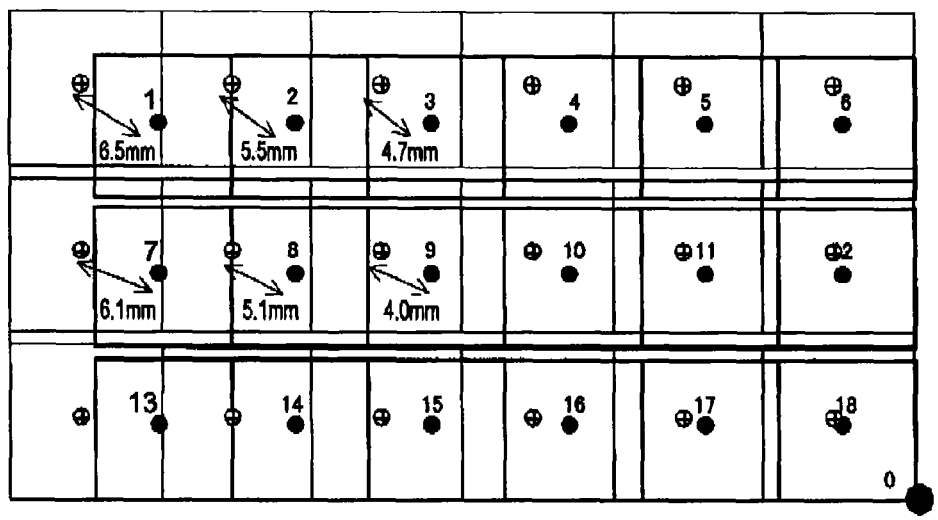
FIG. 12 shows the displacement amount of the multiple Fresnel lens sheet when it is fixed at a bottom right end (second comparison)

FIG. 12 shows the results of calculation using the same multiple Fresnel lens sheet as in the first example when the sheet is fixed at the bottom right end of the sheet. The values of the unit lenses 4, 5 and else are omitted.

As seen from the above examples and comparisons, the present invention can achieve a reduction to a minimum in the displacement of the focus positions from the solar cells and prevention of a decrease in the power generation efficiency even if the elastic behavior of the Fresnel lens sheet under a temperature or humidity change differs from that of the base plate on which the solar cells are disposed.

Although the present invention has been described in terms of exemplary embodiments, it is not limited thereto. It should be appreciated that variations or modifications may be made in the embodiments described by persons skilled in the art without departing from the scope of the present invention as defined by the following claims.

The invention claimed is:

1. A photovoltaic unit comprising:
    an integrated multiple Fresnel lens sheet comprising a sheet integrally provided with multiple Fresnel lenses; and
    a base plate on which solar cells are arranged adjacent to a focus position of each said Fresnel lens, wherein
    the multiple Fresnel lens sheet is fixed to the base plate at a lens sheet fixing portion adjacent to a center of gravity of the sheet, such that the multiple Fresnel lens sheet is fixed in position relative to the base plate at the fixing portion upon thermal expansion of the multiple Fresnel lens sheet, and the multiple Fresnel lens sheet is able to shift relative to the base plate at all positions other than the fixing portion upon thermal expansion of the multiple Fresnel lens sheet, wherein the multiple Fresnel lens sheet has a second fixing portion in addition to the lens sheet fixing portion; and the multiple Fresnel lens sheet is movable at the second fixing portion only in a direction of a line connecting the lens sheet fixing portion and the second fixing portion.

2. The photovoltaic unit according to claim 1, wherein the multiple Fresnel lens sheet is fixed to the base plate at the lens sheet fixing portion adjacent to the center of gravity of the sheet and at a boundary of individual Fresnel lenses.

3. The photovoltaic unit according to claim 1, wherein the second fixing portion is in the vicinity of an end of the entire multiple Fresnel lens sheet.

4. The photovoltaic unit according to claim 2, wherein the multiple Fresnel lens sheet is movable at the second fixing portion only in a direction connecting the lens sheet fixing portion and the second fixing portion.

5. The photovoltaic unit according to claim 4, wherein the second fixing portion is in the vicinity of an end of the entire multiple Fresnel lens sheet.

\* \* \* \* \*